US012506458B2

(12) United States Patent
Luo et al.

(10) Patent No.: US 12,506,458 B2
(45) Date of Patent: Dec. 23, 2025

(54) PACKAGING MODULE AND PACKAGING METHOD OF BAW RESONATOR

(71) Applicant: Ningbo Semiconductor International Corporation (Shanghai Branch), Shanghai (CN)

(72) Inventors: Hailong Luo, Ningbo (CN); Fei Qi, Ningbo (CN)

(73) Assignee: Ningbo Semiconductor International Corporation (Shanghai Branch), Shanghai (CN)

( * ) Notice: Subject to any disclaimer, the term of this patent is extended or adjusted under 35 U.S.C. 154(b) by 726 days.

(21) Appl. No.: 17/249,338

(22) Filed: Feb. 26, 2021

(65) Prior Publication Data

US 2021/0184645 A1 Jun. 17, 2021

Related U.S. Application Data

(63) Continuation of application No. PCT/CN2019/109826, filed on Oct. 4, 2019.

(30) Foreign Application Priority Data

Jul. 19, 2019 (CN) .......................... 201910656689.6

(51) Int. Cl.
*H03H 3/02* (2006.01)
*H03H 9/10* (2006.01)
(Continued)

(52) U.S. Cl.
CPC ............ *H03H 3/02* (2013.01); *H03H 9/1035* (2013.01); *H03H 9/105* (2013.01); *H03H 9/131* (2013.01);
(Continued)

(58) Field of Classification Search
CPC .... H03H 9/105; H03H 2003/021; H03H 3/02; H03H 9/1035; H03H 9/1042; H03H 9/173; H03H 9/174
See application file for complete search history.

(56) References Cited

U.S. PATENT DOCUMENTS 7,596,840 B2 * 10/2009 Iwashita ................ H03H 9/173
29/25.35
2004/0032012 A1 * 2/2004 Wong ..................... H03H 9/105
257/E21.499
(Continued)

FOREIGN PATENT DOCUMENTS

CN 2899285 Y 5/2007
CN 104767500 A 7/2015
(Continued)

*Primary Examiner* — Livius R. Cazan
(74) *Attorney, Agent, or Firm* — Anova Law Group, PLLC

(57) ABSTRACT

The present disclosure provides a packaging module and packaging method of a BAW resonator. The packaging method includes: bonding a BAW resonant device including a first substrate and a resonant structure provided on the first substrate to a second substrate through a bonding layer; forming through holes exposing corresponding electrical connection portions of the resonant structure at a side of the first substrate; and forming a conductive interconnection layer on inner surfaces of the through holes and on a portion of a surface of the first substrate to avoid steps of etching through holes and depositing conductive materials from the bonding layer, so that a material of the bonding layer can be selected to provide good bonding effect, which helps to reduce the process difficulty, and improves the stability of the through holes and the formed packaging module, thereby improving the performance of the BAW resonator packaging structure.

16 Claims, 3 Drawing Sheets

(51) Int. Cl.
*H03H 9/13* (2006.01)
*H03H 9/17* (2006.01)

(52) U.S. Cl.
CPC ....... *H03H 9/173* (2013.01); *H03H 2003/021* (2013.01)

(56) References Cited

U.S. PATENT DOCUMENTS

| | | | |
|---|---|---|---|
| 2004/0183399 | A1 | 9/2004 | Nakatani et al. |
| 2005/0218755 | A1* | 10/2005 | Song ................ H03H 9/173 310/348 |
| 2017/0264264 | A1* | 9/2017 | Huang ............... H03H 9/564 |
| 2019/0379349 | A1* | 12/2019 | Lee .................. H03H 9/105 |

FOREIGN PATENT DOCUMENTS

| | | | |
|---|---|---|---|
| CN | 109586680 A | | 4/2019 |
| CN | 109639251 A | | 4/2019 |
| CN | 109672419 A | | 4/2019 |
| JP | 2005295250 A | | 10/2005 |
| JP | 2006521211 A | | 9/2006 |
| JP | 2008098831 A | | 4/2008 |
| JP | 2014150453 A | | 8/2014 |
| JP | 2018110381 A | | 7/2018 |
| JP | 2018137742 A | | 8/2018 |
| KR | 20190070274 A | * | 6/2019 |
| WO | 2008023478 A1 | | 2/2008 |
| WO | 2016174789 A1 | | 11/2016 |

\* cited by examiner

PACKAGING MODULE AND PACKAGING METHOD OF BAW RESONATOR

CROSS-REFERENCES TO RELATED APPLICATIONS

This application is a continuation application of PCT Patent Application No. PCT/CN2019/109826, filed on Oct. 4, 2019, which claims priority to Chinese patent application No. 201910656689.6, filed on Jul. 19, 2019, the entirety of all of which is incorporated herein by reference.

FIELD OF THE DISCLOSURE

The present disclosure generally relates to the field of radio frequency product packaging technology and, more particularly, relates to a packaging module and packaging method of a bulk acoustic wave (BAW) resonator.

BACKGROUND

With continuous development of wireless communication technology, to meet multifunctional needs of various wireless communication terminals, terminal device needs to be able to use different carrier frequency spectrums to transmit data. Meanwhile, to support sufficient data transmission rates within a limited bandwidth, strict performance requirements are raised for a radio frequency system. A radio frequency filter is an important part of the radio frequency system, which can filter out interference and noise outside a communication spectrum to meet requirements of the radio frequency system and the communication protocol for a signal-to-noise ratio. Take a mobile phone as an example, since each frequency band needs a corresponding filter, one mobile phone may need to include dozens of filters.

Surface acoustic wave (SAW) filters and bulk acoustic wave (BAW) filters are two most mainstream implementations of the radio frequency filter. An SAW filter has a simple structure. Compared with conventional cavity filter and ceramic filter, the SAW filter has a small size, and combines low insertion loss and good suppression performance. The SAW filter is widely used in 2G and 3G receiver front ends, duplexers and receivers, and can satisfy frequency bands including GSM, CDMA, 3G and a portion of 4G. But an operating frequency of the SAW filter is inversely proportional to an electrode linewidth. When the frequency is greater than 1 GHz, selectivity of this filter decreases, and when the operating frequency is above 2.4 GHz, the electrode line width is less than 0.5 µm, which leads to large high-frequency insertion loss, and degradation of quality factor and power tolerance. The SAW filter is also very sensitive to temperature (temperature rise will cause a drop of frequency response up to 4 MHz). Thus, application is extremely limited. In comparison, because sound wave in a BAW filter propagates vertically, its frequency is inversely proportional to a thickness of a film, that is, a size can be reduced as the frequency rises, and communication requirements within 20 GHz can be met theoretically. Furthermore, the BAW filter has advantages of lower insertion loss, high quality factor (Q value above 1000), low sensitivity to temperature changes, and integration on IC chips. With popularization of 4G and gradual development of 5G, the BAW filter has become a preferred filter for solving many interference problems.

A BAW resonator is a basic component of the BAW filter. By cascading different BAW resonators, the BAW filter that meets different performance requirements can be made. The BAW resonator usually includes a substrate, a cavity formed on the substrate, and a resonant structure on the cavity. The resonant structure includes a lower electrode, a piezoelectric film, and an upper electrode. The resonant structure is used to convert electrical signals to elastic waves through physical vibration.

In a BAW resonator, a resonant structure including a piezoelectric layer is suspended on a cavity on a support substrate. During packaging, a circle of dry film is coated on a cap, the cap is aligned with a position of the cavity and bonded to the resonant structure, and then a through-silicon via (TSV) process is performed to electrically lead out upper and lower electrodes of the resonant structure to the cap. However, this method needs to etch through holes in the thick dry film, and process control difficulty is large. After the through holes are etched, conductive materials need to be deposited on the dry film. Due to poor stability of the dry film itself, the formed conductive plugs have poor quality and electrical contact is not stable.

BRIEF SUMMARY OF THE DISCLOSURE

One aspect of the present disclosure provides a packaging method of a bulk acoustic wave (BAW) resonator, including: providing a BAW resonant device, that the BAW resonant device includes a first substrate and a resonant structure disposed on the first substrate, and a first gap is formed between the resonant structure and the first substrate; bonding the BAW resonant device to a second substrate at a side of the resonant structure away from the first substrate through a bonding layer, that a second gap is provided between the resonant structure and the second substrate and is substantially surrounded by the bonding layer, and the second gap is at least partially aligned with the first gap; forming through holes that pass through the first substrate and expose corresponding electrical connection portions of the resonant structure around the first gap; and forming a conductive interconnection layer on inner surfaces of the through holes and on a portion of a surface of the first substrate at a periphery of the through holes.

Another aspect of the present disclosure provides a packaging module of a bulk acoustic wave (BAW) resonator, including: a second substrate and a bonding layer, that the bonding layer is formed on a portion of the second substrate; a BAW resonant device, that the BAW resonant device is bonded to the bonding layer, the BAW resonant device includes a first substrate and a resonant structure provided on a surface of the first substrate facing toward the second substrate, a first gap is formed between the resonant structure and the first substrate, the bonding layer is sandwiched between the second substrate and the resonant structure, a second gap is provided between the second substrate and the resonant structure and is substantially surrounded by the bonding layer, the second gap is at least partially aligned with the first gap, the BAW resonant device is also provided with through holes, and the through holes pass through the first substrate on a periphery of the first gap and expose corresponding electrical connection portions of the resonant structure; and a conductive interconnection layer, that the conductive interconnection layer is formed on inner surfaces of the through holes and on a portion of a surface of the first substrate at a periphery of the through holes.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
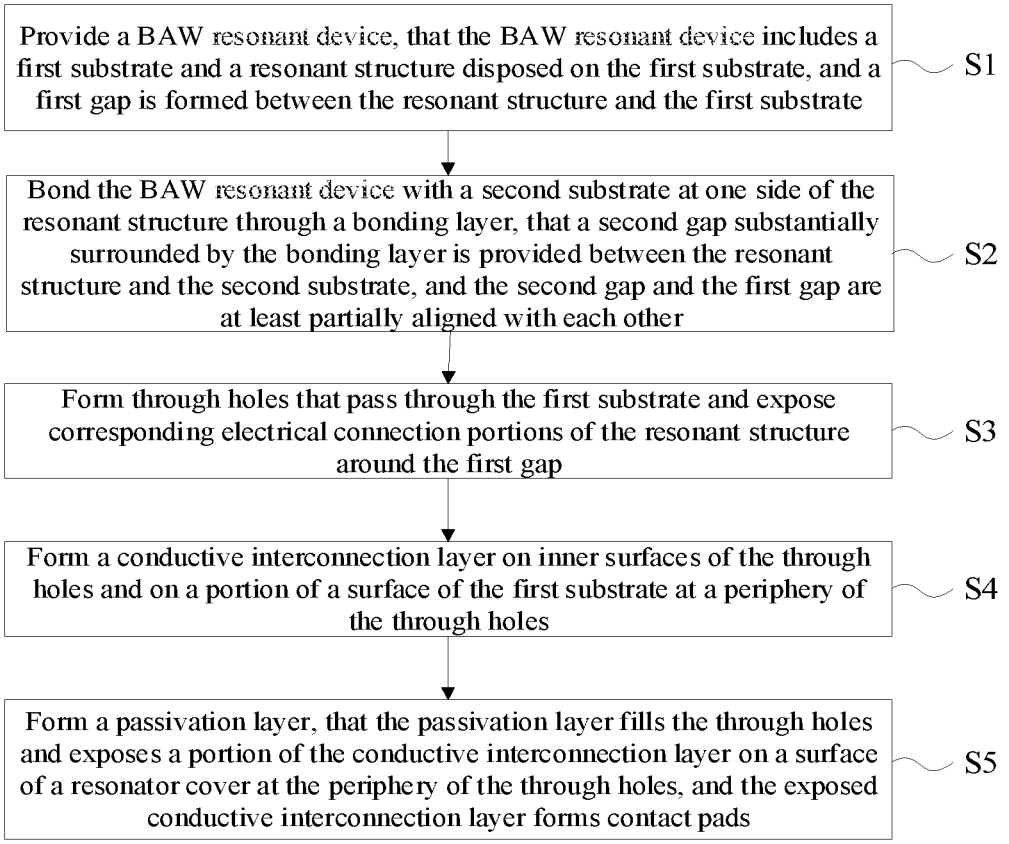
FIG. 1 illustrates a schematic flowchart of an exemplary method for fabricating an exemplary BAW resonator according to some embodiments of the present disclosure.

The packaging module and packaging method of a BAW resonator and a BAW filter of the present disclosure will be described in further detail below with reference to the accompanying drawings and exemplary embodiments. According to the following description, advantages and features of the present disclosure will be clearer. It should be noted that the drawings are in a very simplified form and all use imprecise proportions, which are only used to conveniently and clearly assist in explaining the embodiments of the present disclosure. The embodiments of the present disclosure should not be considered as limited to those alternative shapes of areas shown in the drawings. For the sake of clarity, in all the drawings used to assist in describing the embodiments of the present disclosure, same components are marked with same reference numerals in principle, and repeated descriptions thereof are omitted.

It should be noted that the terms "first", "second", etc., hereinafter are used to distinguish between similar elements, and are not necessarily used to describe a specific order or time sequence. It is to be understood that, under appropriate circumstances, these terms so used can be replaced, for example, to enable the embodiments of the present disclosure described herein to be operated in other sequences than described or shown herein. Similarly, if the method described herein includes a series of steps, and an order of these steps presented herein is not necessarily the only order in which these steps can be performed, and some of the described steps may be omitted and/or some other steps that are not described herein can be added to the method.

FIG. 1 illustrates a schematic flowchart of an exemplary method for fabricating an exemplary BAW resonator according to some embodiments of the present disclosure. Referring to FIG. 1, a packaging method of a BAW resonator according to some embodiments of the present disclosure includes the following steps:

S1: providing a BAW resonant device, that the BAW resonant device includes a first substrate and a resonant structure disposed on the first substrate, and a first gap is formed between the resonant structure and the first substrate;

S2: bonding the BAW resonant device with a second substrate at one side of the resonant structure through a bonding layer, that a second gap substantially surrounded by the bonding layer is provided between the resonant structure and the second substrate, and the second gap and the first gap are at least partially aligned with each other;

S3: forming through holes that pass through the first substrate and expose corresponding electrical connection portions of the resonant structure around the first gap;

S4: forming a conductive interconnection layer on inner surfaces of the through holes and on a portion of a surface of the first substrate at a periphery of the through holes; and S5: forming a passivation layer, that the passivation layer fills the through holes and exposes a portion of the conductive interconnection layer on a surface of a resonator cover at the periphery of the through holes, and the exposed conductive interconnection layer forms contact pads.

The packaging method of the BAW resonator according to the embodiments of the present disclosure will be further described below in conjunction with schematic cross-sectional views during implementation processes.

Figure 2:
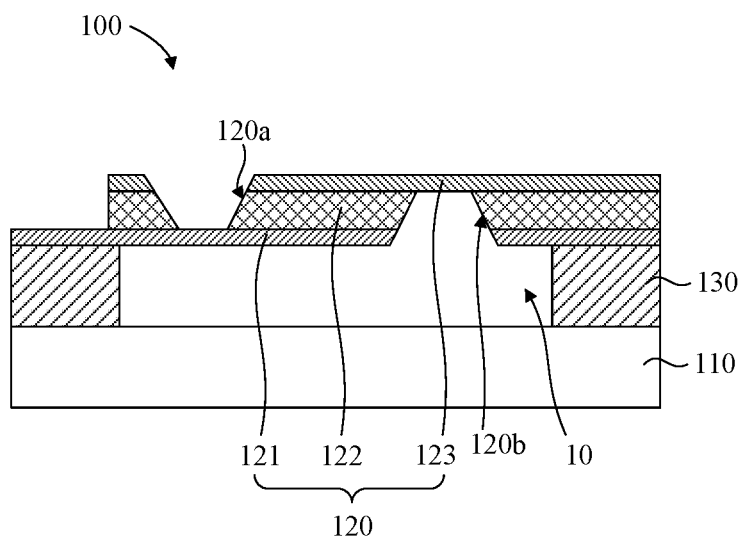
FIG. 2 illustrates a schematic cross-sectional view of an exemplary BAW resonant device according to some embodiments of the present disclosure.
Figure 3:
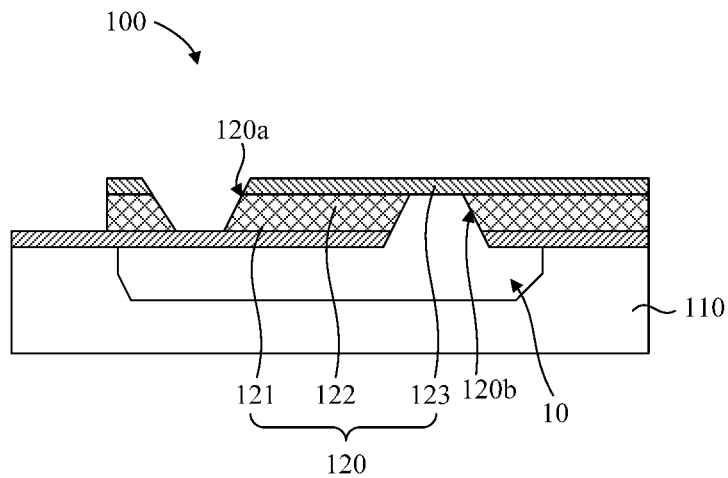
FIG. 3 illustrates a schematic cross-sectional view of an exemplary BAW resonant device according to some other embodiments of the present disclosure.

FIG. 2 illustrates a schematic cross-sectional view of an exemplary BAW resonant device according to some embodiments of the present disclosure. FIG. 3 illustrates a schematic cross-sectional view of an exemplary BAW resonant device according to some other embodiments of the present disclosure. Referring to FIG. 2 or FIG. 3, in step S1, a BAW resonant device 100 is provided. The BAW resonant device 100 includes a first substrate 110 and a resonant structure 120 disposed on the first substrate 110. A first gap 10 is formed between the resonant structure 120 and the first substrate 110.

Alternatively, the resonant structure 120 includes a first electrode 121 close to the first substrate 110, a piezoelectric layer 122 on the first electrode 121, and a second electrode 123 on the piezoelectric layer 122. The first electrode 121 may be used as an input (or output) electrode that receives (or provides) electrical signals such as radio frequency (RF) signals. For example, when the second electrode 123 is used as the input electrode, the first electrode 121 may be used as the output electrode, and when the second electrode 123 is used as the output electrode, the first electrode 121 may be used as the input electrode. The piezoelectric layer 122 converts the electrical signals input through the first electrode 121 or the second electrode 123 into bulk acoustic waves. For example, the piezoelectric layer 122 converts the electrical signals into the bulk acoustic waves through physical vibration.

Referring to FIG. 2, in some embodiments, the BAW resonant device 100 includes a support layer 130 disposed on the first substrate 110, the first gap 10 is substantially defined or enclosed by the support layer 130, and the resonant structure 120 (here, alternatively, is a layer where the first electrode 121 of the resonant structure 120 is located) is partially in contact with the support layer 130 around the first gap 10. But not limited to this, referring to FIG. 3, in some other embodiments of the present disclosure, in the BAW resonant device, a groove is formed in the first substrate 110, and the groove defines the first gap 10 between the resonant structure 120 and the first substrate 110. The resonant structure 120 (here alternatively refers to the layer where the first electrode 121 of the resonant structure 120 is located) and the first substrate 110 around the groove overlap each other.

Alternatively, the first substrate 110 may be made of any suitable substrate known to those skilled in the art. For example, the first substrate 110 may be made of at least one of the following materials: silicon (Si), germanium (Ge), germanium silicon (SiGe), carbon silicon (SiC), silicon germanium (SiGeC), indium arsenide (InAs), gallium arsenide (GaAs), indium phosphide (InP) or other III/V compound semiconductors; or multi-layer structures formed by these semiconductors, such as silicon-on-insulator (SOI), silicon-on-insulator (SSOI), silicon-germanium-on-insulator (S—SiGeOI), silicon germanium-on-insulator (SiGeOI), and germanium on insulator (GeOI)); or Double Side Polished Wafers (DSP); or ceramic substrate, quartz or glass substrate, etc., such as alumina, etc. In some embodiments, the first substrate 110 is made of a P-type high-resistance single crystal silicon wafer with a <100> crystal orientation.

As an example, fabrication of the BAW resonant device may include the following processes. First, a piezoelectric stack film layer is fabricated on a preparation substrate, that the piezoelectric stack film layer includes a first electrode layer, a piezoelectric layer, and a second electrode layer, stacked in sequence. Before the piezoelectric stack film layer is fabricated, an isolation layer with a thickness of about 1 μm can be formed on the preparation substrate, and the isolation layer can be used as a barrier material for removing the preparation substrate. Then, the support layer 130 is formed on the piezoelectric stack film layer, and the first gap is formed in the support layer 130 through a photomask and etching process. Next, the first substrate 110 is bonded on the support layer 130 to transfer the piezoelectric stack film layer to the first substrate 110, and a backside etching process is used to remove the preparation substrate. Then, the photomask and etching process is used to process the piezoelectric stack film to form the resonant structure 120, and the support layer 130 encloses the first gap 10 between the resonant structure 120 and the first substrate 110, as shown in FIG. 2.

The fabrication of the BAW resonant device 100 of the present disclosure is not limited to the above method. For example, in some other embodiments, the first gap 10 may not be formed by the support layer, but a sacrificial layer (not shown) may be used to directly form the first gap 10 and the resonant structure 120 on the first substrate 110, to obtain the BAW resonant device 100. Referring to FIG. 3, alternative processes are included below.

First, a portion of a thickness in a partial area of the first substrate 110 is removed by etching to form a groove (not shown) for forming the first gap. Here, the first substrate 110 may include a substrate base (not shown), and at least one thin film (not shown) covering the substrate base (not shown), or a bare chip made of a semiconductor material.

Then, a sacrificial layer (not shown) is filled in the groove, and a top surface of the sacrificial layer is flush with a top surface of the first substrate 110, or may be higher than the top surface of the first substrate 110, or slightly lower than the top surface of the first substrate 110. The sacrificial layer may have a single-layer structure or a stacked-layer structure.

Afterwards, the top surfaces of the first substrate 110 and the sacrificial layer are covered with the piezoelectric stack film layer, that the piezoelectric stack film layer includes the first electrode layer, the piezoelectric layer, and the second electrode layer, stacked in sequence. Through exposure, development, and etching processes, the first electrode layer, the piezoelectric layer, and the second electrode layer or the second electrode layer, the piezoelectric layer, and the first electrode layer, are sequentially patterned, to define the first electrode 121, the piezoelectric layer 122 on the first electrode 121, and the second electrode 123 on the piezoelectric layer 122, thereby forming the resonant structure 120.

Then, a release hole (not shown) is opened in the resonant structure 120 near an edge in a region of the first gap 10, and the sacrificial layer is removed by introducing an etchant into the release hole to re-empty the groove, thereby obtaining the first gap 10 between the resonant structure 120 and the first substrate 110. The first gap 10 is a groove structure with an entire bottom recessed in the first substrate 110. So far, the processes of providing the BAW resonant device 100 in step S1 are completed.

In some other embodiments of the present disclosure, another method of using a sacrificial layer to directly form the first gap 10 and the resonant structure 120 on the first substrate 110 to obtain the BAW resonant device 100 may be provided. Alternative processes are included below.

First, a sacrificial layer (not shown) is fully covered on the first substrate 110. The sacrificial layer may be a single-layer structure or a stacked-layer structure.

Then, exposure, development, and etching processes are performed to etch the sacrificial layer to pattern it to form a patterned sacrificial layer for forming the first gap 10.

Next, top surfaces of the first substrate 110 and the sacrificial layer are sequentially covered with the piezoelectric stack film layer, that the piezoelectric stack film layer includes the first electrode layer, the piezoelectric layer, and the second electrode layer, stacked in sequence. Through exposure, development, and etching processes, the first electrode layer, the piezoelectric layer, and the second electrode layer are sequentially patterned or the second electrode layer, the piezoelectric layer, and the first electrode layer are sequentially patterned, to define the first electrode 121, the piezoelectric layer 122 on the first electrode 121, and the second electrode 123 on the piezoelectric layer 122, to form the resonant structure 120.

Then, a release hole (not shown) may be opened on an edge area of the resonant structure 120, and the sacrificial layer may be removed by introducing an etchant into the release hole, thereby obtaining the first gap 10 between the resonant structure 120 and the first substrate 110. The first gap 10 is projected on the first substrate 110. So far, the processes of providing the BAW resonant device 100 in step S1 are completed.

In addition, it should be noted that when the first substrate 110 is a wafer, providing the BAW resonant device 100 may not be an independent device, that is, a number of the resonant structure 120 on the first substrate 110 is not limited to one. When multiple resonant structures 120 are formed on the first substrate 110 at a same time, there is the first gap 10 between each resonant structure 120 and the first substrate 110. Adjacent first gaps can be separated through corresponding support layers or a first substrate material, and adjacent resonant structures 120 may be disconnected from each other, or some of film layers may be connected to each other.

In addition, cross-sections of the resonant structure 120 are not limited to the structures shown in FIG. 2 and FIG. 3, and can be alternatively designed according to alternative needs. A planar shape of a resonant part that performs resonant operation in the resonant structure 120 may be a rectangle, or may be a circle, an ellipse, or a polygon other than a rectangle, such as a pentagon, a hexagon, and the like. Furthermore, a planar shape of the first gap 10 may be a rectangle, or a circle, an ellipse, or a polygon other than a rectangle, such as a pentagon, a hexagon, and the like.

In some embodiments, taking the BAW resonant device 100 shown in FIG. 2 as an example, the resonant structure 120 includes the first electrode 121 facing towards the first substrate 100, the piezoelectric layer 122 on the first electrode 121, and the second electrode 123 on the piezoelectric layer 122. The first electrode 121, the piezoelectric layer 122, and the second electrode 123 are formed by a patterning process. The first electrode 121 and the second electrode 123 are exposed in a direction away from the first substrate 110, and have a step difference.

Alternatively, the resonant structure 120 may be formed in a double trench (Air Trench) structure, such as a first trench 120a and a second trench 120b in FIG. 2 and FIG. 3, that the first trench 120a penetrates the second electrode 123 and the piezoelectric layer 122, and exposes the first electrode 121; the second trench 120b penetrates the first electrode 121 and the piezoelectric layer 122, and exposes the second electrode 123; and the second trench 120b is connected to the first gap 10.

The support layer 130 can be made of silicon oxide, silicon nitride, silicon oxynitride, aluminum oxide, aluminum nitride, titanium oxide, titanium nitride, amorphous carbon, etc. The support layer 130 can also be a stacked layer of two or more materials. For example, the support layer 130 may have a stacked structure of silicon oxide and silicon nitride, and the silicon nitride layer is in contact with the resonant structure 120. The first electrode 121 and the second electrode 123 can be made of one or more of conductive materials such as molybdenum (Mo), tungsten (W), aluminum, copper, iridium (Ir), rubidium (Ru), and doped polysilicon. The piezoelectric layer 122 can be made of one or more of piezoelectric materials such as quartz, aluminum nitride (AlN), zinc oxide (ZnO), lead zirconate titanate (PZT), lithium niobium oxide ($LiNbO_3$), lithium tantalum oxide ($LiTaO_3$), etc. The piezoelectric layer 122 may also be doped with rare earth elements. In some embodiments, the first electrode 121 and the second electrode 123 are made of, for example, molybdenum, and the piezoelectric layer 122 is made of, for example, aluminum nitride. A thickness of the first electrode 121 and the second electrode 123 is approximately in a range of about 100 nm to about 200 nm. A thickness of the piezoelectric layer 122 is in a range of about 1 µm to about 3 Molybdenum can be deposited by a PVD (physical vapor deposition) process or a magnetron sputtering process, and aluminum nitride can be deposited by the PVD (physical vapor deposition) process or an MOCVD (metal organic chemical vapor deposition) process.

Figure 4:
FIG. 4 illustrates a schematic cross-sectional view of an exemplary second substrate according to some embodiments of the present disclosure.

After the BAW resonant device 100 is formed, the resonant structure 120 needs to be covered at a side of the resonant structure 120 away from the first substrate 110, so that both sides of the resonant structure 120 have vibration spaces. In some embodiments, in step S2, the second substrate is provided as a cap wafer, and the first substrate 110 is used as a carrier wafer. FIG. 4 illustrates a schematic cross-sectional view of an exemplary second substrate according to some embodiments of the present disclosure. Referring to FIG. 4, the second substrate 200 may use a substrate material similar to that of the first substrate 110. Moreover, to better cover the BAW resonant device 100 and provide sufficient vibration space for the resonant structure 120, a bonding layer material with a certain thickness is formed on the second substrate 200, and the bonding layer material is patterned, to form a bonding layer 210 having a second gap 20.

The second substrate 200 may be bonded to the first substrate 110 by vacuum bonding or bonding in a vacuum environment, so that the bonding layer 210 may be a conventional bonding material, such as silicon oxide, silicon nitride, silicon oxynitride, ethyl silicate, etc., and may also be an adhesive such as a light-curing material or a heat-curing material, such as an adhesive film (Die Attach Film, DAF) or a dry film (Dry Film). When the first substrate 110 and the second substrate 200 are bonded, the resonant structure 120 is formed on the first substrate 110. A contact area between the second substrate 200 and the first substrate 110 includes both a surface of the support layer 130 and a surface of the resonant structure 120, and there is a certain step difference between the two surfaces. For the resonant structure 120 shown in FIG. 2 or FIG. 3, a side of the resonant structure 120 facing towards the second substrate has an opening, that the opening is located at a periphery of the first gap 10 and the second gap 20 and exposes at least a portion of a surface of corresponding electrical connection portions of the resonant structure 120 facing towards the second substrate. In other words, the first electrode 121 and the second electrode 123 have a step difference at the opening that exposes the electrical connection portions of the resonant structure 120. Therefore, to form a better seal between the first substrate 110 and the second substrate 200 and tolerate the step difference of the resonant structure 120 on the periphery of the first gap 10, a material selected for the bonding layer 210 needs to be able to: be patterned, be cured under certain conditions, stably adhere to upper and lower materials, and be elastic (be tolerant of a material with certain deformation or a material with less hardness), so as to tolerate a certain step height difference when the second substrate 200 and the resonant structure 120 are subsequently bonded. The material of the bonding layer 210 is, for example, a light-curing material, a heat-curing material, or a combination of the light-curing material and the heat-curing material, which can lose its elasticity through light, and cooling after heating. In some embodiments, the bonding layer 210 is, for example, a dry film. A thickness of the dry film is about 10 µm to about 20 µm, and its formation method can adopt a process of "sticking dry film-exposure developing-etching-demolding" or a process of "substrate cleaning treatment-sticking dry film-exposing developing-etching-demolding" for formation. Process conditions of "sticking dry film" include: a process temperature of about 80° C. to about 120° C. (for example, about 110° C.), and a process environment of being vacuum. Process conditions of "exposure and development" include: a UV exposure under vacuum conditions, and standing for a while after exposure, that a radiation dose of the UV exposure is, for example, about 200 $mJ/cm^2$ to about 300 $mJ/cm^2$. The exposed bonding layer 210 is pre-baked at a temperature of about 100° C. to about 150° C. (for example, about 130° C.) for about 100 seconds to about 300 seconds (for example, about 200 seconds). At a room temperature, a developer is spin-sprayed on the pre-baked bonding layer 210 many times (for example, 3 times) to develop the pre-baked bonding layer 210, that the developer is PGMEA, and its components include propylene-glycol-methyl-ether-acetate, and a molecular formula of propylene-glycol-methyl-ether-acetate is $C_6H_{12}O_3$. The dry film formed on the second substrate 200 is, for example, a ring structure, and a range defined by the dry film may be at least partially aligned with a defined range of the support layer in the BAW resonant device 100 (that is, the second gap formed subsequently and the first gap are at least partially aligned with each other), to form a cavity defining the resonant structure 120 between the first substrate 110 and the second substrate 200 after bonding.

Figure 5:
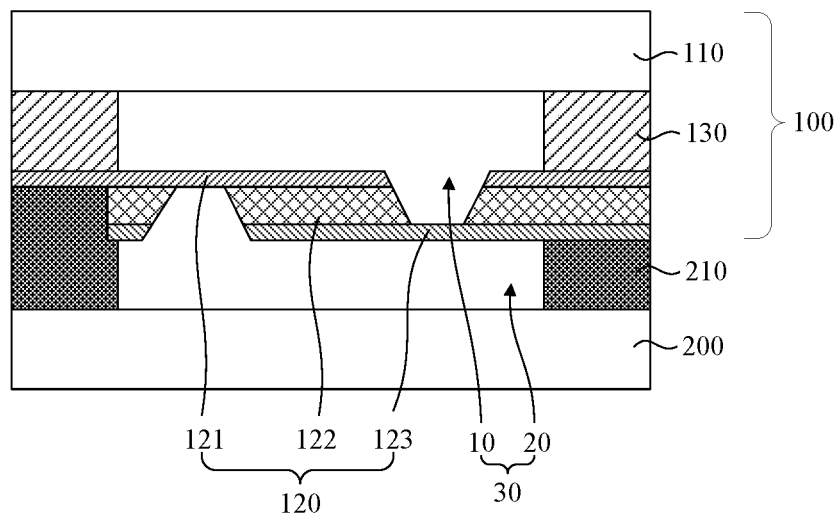
FIG. 5 illustrates a schematic cross-sectional view after bonding an exemplary second substrate by using an exemplary packaging method of a BAW resonator according to some embodiments of the present disclosure.

FIG. 5 illustrates a schematic cross-sectional view after bonding an exemplary second substrate by using an exemplary packaging method of a BAW resonator according to some embodiments of the present disclosure. Referring to FIG. 5, bonding operations in step S2 of the packaging method of the BAW resonator of some embodiments can be performed. Alternatively, the BAW resonant device 100 is bonded to the second substrate 200 at the side of the resonant structure 120 through the bonding layer 210. The second gap 20 substantially surrounded by the bonding layer 210 is provided between the resonant structure 120 and the second substrate 200, and the second gap 20 surrounded by the bonding layer 210 and the first gap 10 are at least partially aligned with each other. The first gap 10 and the second gap 20 may not be connected, or may be connected. When the first gap 10 and the second gap 20 are connected, they form a cavity 30 between the first substrate 110 and the second substrate 200, and a portion of the resonant structure 120 used for vibration is confined in the cavity 30. Process conditions of bonding the second substrate 200 and the BAW resonant device 100 include: a process pressure of about 1 Pa to about $10^5$ Pa, bonding in a vacuum environment, a temperature of about 150° C. to about 200° C. (for example, about 150° C.), and a pressure time of about 20 min to about 30 min. Therefore, under a premise of ensuring bonding performance, resonance performance of the product is prevented from being affected. After the bonding is completed, the bonding layer 210 is solidified by light, and cooling after heating, that is, the bonding layer 210 loses its elasticity, so that the second substrate 200 and the BAW resonant device 100 are reliably bonded together. A process of curing the bonding layer 210 can be a high-temperature curing process, where a curing temperature is about 180° C. to about 220° C. (for example, about 190° C.), and a curing time is about 1.5 hours to about 2 hours (for example, about 2 hours). In some other embodiments of the present disclosure, the process of curing the bonding layer 210 can also be a UV curing process, where a radiation dose of the UV curing can be selected from about 200 mJ/cm$^2$ to about 300 mJ/cm$^2$, which is the same as the light used by the UV exposure process to expose the bonding layer 210, to simplify the process and reduce costs.

Alternatively, after the first substrate 110 and the second substrate 200 are bonded, the bonding layer 210 has a certain thickness and is a hollow structure, thereby defining the second gap 20 between the resonant structure 120 and the second substrate 200. The second gap 20 and the above-mentioned first gap 10 are respectively arranged on upper and lower sides of the resonant structure 120 and connected to each other, thereby forming the cavity 30 between the first substrate 110 and the second substrate 200, and confining the resonant structure 120 in the cavity 30. In other words, a shape and size of the second gap may be the same as the first gap 10, or not completely the same, as long as after bonding, the second gap 20 can make the first electrode, the piezoelectric layer, and the second electrode of the resonant structure 120 to have a sufficient portion overlapping the first gap 10 and the second gap 20 at the same time, thereby forming an effective resonance region of the resonator.

In some embodiments, a shape of a bottom surface of the cavity 30 is a rectangle, but in some other embodiments, according to designs of the resonant operation of the resonant device, the shape of the bottom surface of the cavity 30 may also be a circle, an ellipse or a polygon other than a rectangle, such as a pentagon, a hexagon, etc.

In some embodiments, the dry film can be used to bond the BAW resonant device 100 and the second substrate 200. The dry film has a low hardness and can tolerate a certain step height difference, so that it can form good contact with the support layer 130, and the electrode 121 and the second electrode 123 of the resonant structure 120, and the bonding effect is good.

It should be noted that, in some other embodiments of the present disclosure, when the bonding layer 210 does not have elasticity, it can be chosen to first cover the surface of the resonant structure 120 facing away from the first substrate 110 with a sufficiently thick bonding material and a surface of the bonding material is planarized. At this time, when the resonant structure 120 has the opening at the periphery of the first gap exposing the corresponding electrical connection portions, the bonding layer 210 can also fill the opening. Next, the planarized bonding material is etched, until the surface of the resonant structure 120 facing away from the first substrate 110 is exposed to form the bonding layer 210 with the second gap 20. After that, through direct molecular adsorption force (or molecular bonding force) formed between the bonding layer 210 and the second substrate 200, the second substrate 200 is bonded to the bonding layer 210, to close the second gap 20. Since in this method of forming the bonding layer 210 with the second gap 20, the bonding layer 210 can fill up the opening (not shown) of the resonant structure 120 in the periphery of the first gap 10 and has a flattened surface, it can tolerate a certain step height difference, and can form good contact with the support layer 130 and the first electrode 121 and the second electrode 123 of the resonant structure 120, so that the second substrate 200 can have good bonding effect.

Next, the first electrode 121 and the second electrode 123 of the resonant structure 120 need to be led out, to control from outside of the package structure and obtain relevant electrical parameters in the package structure from the outside. In some embodiments, due to a low hardness of the bonding layer 210, if a through hole etching is performed and a conductive material is deposited therein, it is difficult to control the process on one hand, and on the other hand the conductive material is not easy to form a continuous film, and conductive performance and stability are poor. Therefore, the following processes are avoided to be performed at a side of the second substrate 200, but are performed at a side of the first substrate 110.

Figure 6:
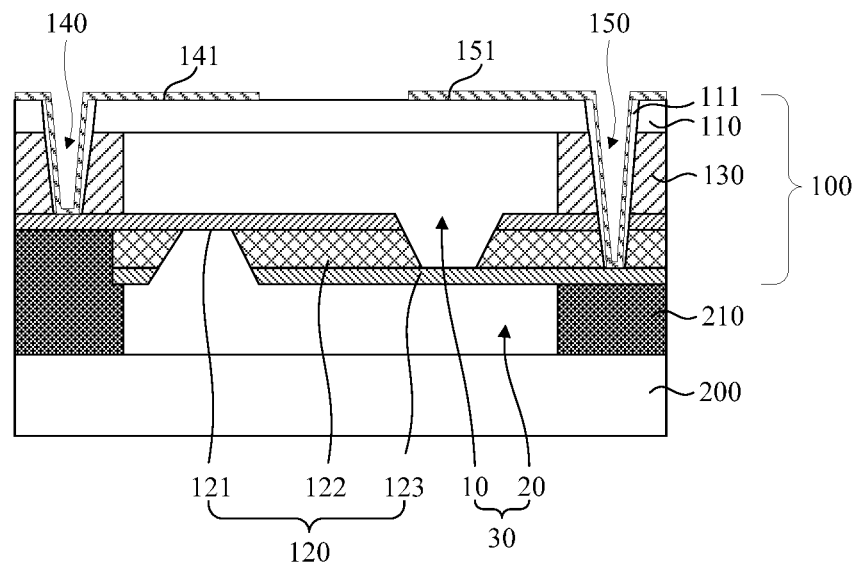
FIG. 6 illustrates a schematic cross-sectional view of an exemplary conductive interconnection layer formed by using an exemplary packaging method of a BAW resonator according to some embodiments of the present disclosure.

FIG. 6 illustrates a schematic cross-sectional view of an exemplary conductive interconnection layer formed by using an exemplary packaging method of a BAW resonator according to some embodiments of the present disclosure. Referring to FIG. 6, after performing step S3 in some embodiments, a first through hole 140 and a second through hole 150 can be formed in the BAW resonant device 100. Alternatively, the following processes may be included.

First, the first substrate 110 is thinned at a side away from the second substrate 200. Thinning the first substrate 110 facilitates an etching process corresponding to the through holes. Generally, a thickness of the first substrate 110 needs to be reduced to be less than about and the thickness of the thinned first substrate 110 in some embodiments is about 60 µm.

Then, for example, using TSV technology, the etching process is performed on the side of the first substrate 110 to form the first through hole 140 and the second through hole 150 respectively. The first through hole 140 exposes a portion of the first electrode 121 (i.e., a first electrical connection portion) of the resonant structure 120, and the second through hole 150 exposes a portion of the second electrode 123 (i.e., a second electrical connection portion) of the resonant structure 120. Alternatively, the first through hole 140 may be formed through a first photomask process and etching process, and the etching process for forming the first through hole 140 stops when the first electrode 121 is exposed, and then through a second photomask process to cover other areas, the second through hole 150 is formed by an etching process, and the etching process of the second through hole 150 stops when the second electrode 123 is exposed. Sizes of the first through hole 140 and the second through hole 150 may be determined according to ranges of the electrodes to be exposed and etching conditions. In some embodiments, an upper opening diameter of the first through hole 140 and the second through hole 150 is about 20 μm to about 70 μm, and a depth of the first through hole 140 and the second through hole 150 is about 60 μm to about 100 μm, alternatively about 70 μm to about 80 μm. That is to say, in some embodiments, the corresponding electrical connection portions of the resonant structure 120 include: the first electrical connection portion, including a portion of the first electrode 121 extending out of the first gap 10, and the second electrical connection portion, including a portion of the second electrode 123 extending out of the first gap 10.

Continuing to refer to FIG. 6, after performing step S4 in some embodiments, a conductive interconnection layer can be formed on inner surfaces of the first through hole 140 and the second through hole 150 and on a portion of the surface of the first substrate 110 around the two through holes. Alternatively, the following processes can be included. First, a seed layer is formed on surfaces of the first through hole 140, the second through hole 150, and the first substrate 110. The seed layer may be formed by PVD or sputtering. In some embodiments, when a main material of the conductive interconnection layer is copper, TiCu can be used as a seed layer material. Then, the BAW resonant device 100 including the seed layer is placed in an electrolytic tank of an electrolytic apparatus or an electroless plating solution of an electroless plating apparatus, and is taken out after a set time, and a copper conductive layer is formed on the surfaces of the first through hole 140, the second through hole 150, and the first substrate 110. Then, a photolithography combined with etching process can be used to remove unnecessary copper conductive layer and seed layer on the surface of the first substrate 110 to form the conductive interconnection layer. The conductive interconnection layer covering the first through hole 140 is defined as a first conductive interconnection layer 141, and the conductive interconnection layer covering the second through hole 150 is defined as a second conductive interconnection layer 151. In some embodiments, since the support layer 130 is provided between the first substrate 110 and the first electrode 121 of the resonant structure 120, the first through hole 140 and the second through hole 150 both pass through the first substrate 110 and the support layer 130. Therefore, the first conductive interconnection layer 141 is in electrical contact with the first electrode 121 of the resonant structure 120, and the second conductive interconnection layer 151 is in electrical contact with the second electrode 123 of the resonant structure 120. In some other embodiments (as shown in FIG. 3), there is no need to provide the support layer about a height of the first gap 10 between the resonant structure 120 and the first substrate 110, so that the through holes can be reduced in depth compared to the through holes in FIG. 6. In addition, in some other embodiments of the present disclosure, the deposited conductive material may include one or more of metal materials such as copper, nickel, zinc, tin, silver, gold, tungsten, and magnesium, or include alloys including elements such as copper, nickel, zinc, tin, silver, gold, tungsten, and magnesium. The conductive material can be deposited using a process such as physical vapor deposition. Since electroplating and electroless plating processes have good hole filling effects, electroplating or electroless plating processes are preferably used to deposit the conductive material. In some other embodiments of the present disclosure, the material of the conductive interconnection layer may be the same as the material of the second electrode and the first electrode, and the deposition process conditions and the process conditions of etching the second electrode and the first electrode are also the same, to maximize compatibility with the processes of step S1 and simplify the processes.

In addition, in some embodiments shown in FIG. 6, since the second through hole 150 needs to pass through a material layer where the first electrode 121 is located, and a material layer where the piezoelectric layer 122 is located to expose the second electrode 123, when the electroplating process is performed in the first through hole 140 and the second through hole 150, to prevent the conductive material from covering sidewalls of the first electrode 121 material layer and the piezoelectric layer 122 material layer in the first through hole 140 and the second through hole 150 to cause adverse effect to conductive performance of the first conductive interconnection layer 141 and the second conductive interconnection layer 151, in some embodiments of the present disclosure, before the conductive material is deposited, a sidewall protection layer 111 is formed on inner sidewalls of the first through hole 140 and the second through hole 150 respectively. A method for forming the sidewall protection layer 111 may include the following processes: forming a dielectric layer that fills the first through hole 140 and the second through hole 150; and etching the dielectric layer vertically to make a remaining dielectric layer as the sidewall protection layer 111 that only covers the sidewalls of the first through hole 140 and the second through hole 150. After the sidewall protection layer 111 is formed, bottom surfaces of the first through hole 140 and the second through hole 150 still expose the corresponding electrical connection portions (i.e., electrodes) of the resonant structure 120, that the conductive interconnection layer capable of making electrical contact with the resonant structure 120 can be formed by the above-mentioned electroplating or electroless plating process. Since the sidewalls of the first through hole 140 and the second through hole 150 are different, that the sidewall of the first through hole 140 does not expose sidewalls of the first electrode 121 material layer and the piezoelectric layer 122 material layer, the sidewall protection layer 111 may also cover only the sidewall of the second through hole 150.

In addition, the method of forming the conductive interconnection layer on the surface of the first substrate 110 is not limited to this. In some other embodiments, after a portion of the conductive interconnection layer covering the inner surfaces of the first through hole 140 and the second through hole 150 may be formed first, a conductive material is deposited to form a portion of the conductive interconnection layer covering the surface of the first substrate 110 away from the second substrate 200, so that the portion of the conductive interconnection layer on the first substrate 110 is electrically connected to the portion of the conductive interconnection layer in the through hole 140 and the second through hole 150 respectively.

After the above processes, the formed first conductive interconnection layer 141 and the second conductive interconnection layer 151 electrically connect the first electrode 121 and the second electrode 123 respectively to the surface of the first substrate 110 away from the second substrate 200.

Figure 7:
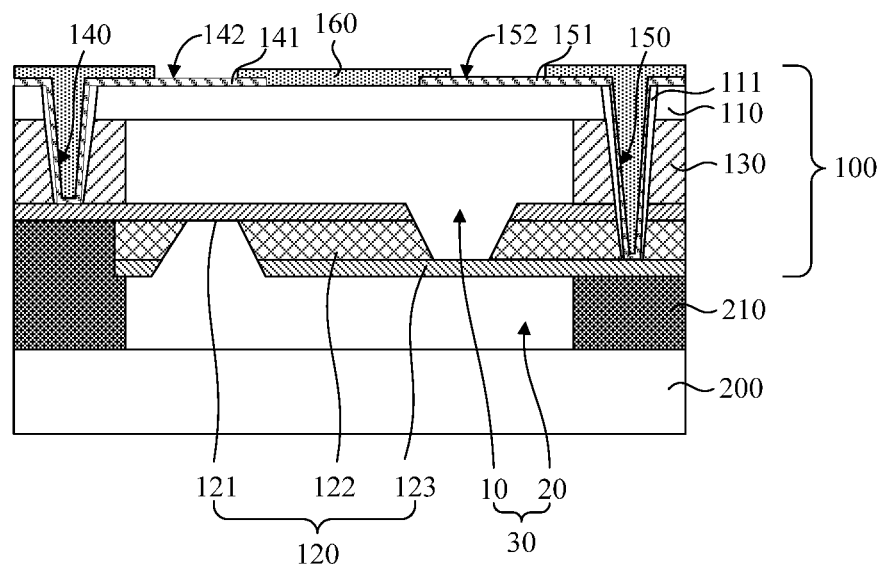
FIG. 7 illustrates a schematic cross-sectional view of exemplary contact pads formed by using an exemplary packaging method of a BAW resonator according to some embodiments of the present disclosure.

FIG. 7 illustrates a schematic cross-sectional view of an exemplary passivation layer and exemplary contact pads formed by using an exemplary packaging method of a BAW resonator according to some embodiments of the present disclosure. Referring to FIG. 7, further, after step S5 is performed in some embodiments, the first through hole 140 and the second through hole 150 can be filled with a passivation layer, and contact pads can be formed on the first substrate 110. Alternatively, forming the contact pads may include the following processes. First, on a surface of the first through hole 140 where the first conductive interconnection layer 141 is formed, a surface of the second through hole 150 where the second conductive interconnection layer 151 is formed, and a surface of the first substrate 110 where the conductive interconnection layer is formed, a passivation layer material is deposited, so that the passivation layer material fills the first through hole 140 and the second through hole 150 and covers the first substrate 110 with a certain thickness. Then a planarization process, such as a CMP process, is performed to remove a portion of a thickness of the passivation layer material, and a remaining passivation layer material is used as a passivation layer 160 to fill the first through hole 140 and the second through hole 150 and be a flat surface on the first substrate 110. Then the passivation layer 160 is etched to form contact openings that expose at least a portion of the first conductive interconnection layer 141 above the first substrate 110 and at least a portion of the second conductive interconnection layer 151 above the first substrate 110, respectively. The exposed first conductive interconnection layer 141 serves as a first contact pad 142, and the exposed second conductive interconnection layer 151 serves as a second contact pad 152.

The passivation layer 160 is used to define positions of the contact pads and protect the formed packaging structure. A material of the passivation layer 160 may include any one or more of dielectric materials such as magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO). The material of the passivation layer 160 can be the same as that of the piezoelectric layer 122, and a same deposition process as that of the piezoelectric layer 122 can be used, so as to be compatible with the fabrication process of the BAW resonant device 100 to a maximum extent, while avoiding problems of temperature drift and introduction of unnecessary stress when other material is used to make the passivation layer, thereby improving the resonance performance of the resonator. In addition, the passivation layer 160 fills the first through hole 140 and the second through hole 150, which can also enhance mechanical support performance of the BAW resonant device 100.

In some embodiments, to control the first electrode 121 and the second electrode 123 of the resonant structure 120 respectively, the first contact pad 142 and the second contact pad 152 are formed respectively. The first contact pad 142 is electrically connected to the first electrode 121 through the first conductive interconnection layer 141, and the second contact pad 152 is electrically connected to the second electrode 123 through the second conductive interconnection layer 151, so that the resonant structure can be electrically controlled from outside of the packaging module.

In the above-mentioned packaging method of the BAW resonator, the BAW resonant device 100 is bonded to the second substrate 200 through the bonding layer 210, and then the through holes are formed at the side of the first substrate 110 to expose the electrical connection portions of the resonant structure 120 in the BAW resonant device 100, and the conductive interconnection layer is formed on the inner surfaces of the through holes and on a portion of the surface of the first substrate, thereby avoiding the steps of etching the through holes and depositing conductive materials from the bonding layer 210. The material of the bonding layer 210 can be selected to provide good bonding effect, which helps to reduce the process difficulty, and improves stability of the conductive interconnection layer and the formed packaging module, thereby helping to improve the performance of the BAW resonator.

The embodiments also include a packaging module of a BAW resonator, which can be fabricated by using the packaging method of the BAW resonator according to the embodiments. Referring to FIG. 7, the packaging module includes the BAW resonant device 100, the second substrate 200 bonded to the BAW resonant device 100, the first through hole 140 and the second through hole 150 formed on the BAW resonant device 100, and, the conductive interconnection layer formed on the BAW resonant device 100.

Alternatively, the BAW resonant device 100 includes the first substrate 110 and the resonant structure 120 disposed at the side of the first substrate 110 facing towards the second substrate 200. The first gap 10 is formed between the resonant structure 120 and the first substrate 110. The BAW resonant device 100 is bonded to the second substrate 200 through the bonding layer 210, and the second gap 20 substantially surrounded by the bonding layer 210 is provided between the resonant structure 120 and the second substrate 200. The second gap 20 is at least partially aligned with the first gap 10 to confine a portion of the resonant structure 120 between the second gap 20 and the first gap 10. The first gap 10 and the second gap 20 may be connected to form the cavity 30, or may not be connected. A portion of the resonant structure 120 overlapping the first gap 10 and the second gap 20 is used as an effective operating area.

In some embodiments, the resonant structure 120 includes the first electrode 121 close to the first substrate 100, the piezoelectric layer 122 on the first electrode 121, and the second electrode 123 on the piezoelectric layer 122. The first through hole 140 and the second through hole 150 are both located at the periphery of the first gap 10 and respectively pass through the first substrate 110 to expose the corresponding electrical connection portions of the resonant structure 120. The electrical connection portions include: the first electrical connection portion including a portion of the first electrode 121 extending out of the first gap 10; and the second electrical connection portion including a portion of the second electrode 123 extending out of the first gap 10. The conductive interconnection layer includes: the first conductive interconnection layer 141 formed on the inner surface of the first through hole 140 and a portion of the first substrate 110 around the first through hole 140, that the first conductive interconnection layer 141 is electrically connected to the first electrode 121 by electrically contacting the first electrical connection portion; and, the second conductive interconnection layer 151 formed on the inner surface of the second through hole 150 and a portion of the first substrate 110 around the second through hole 150, that the second conductive interconnection layer 151 is electrically connected to the second electrode 123 by electrically contacting the second electrical connection portion.

In addition, the packaging module of the above-mentioned BAW resonator may further include the passivation layer 160, which fills the first through hole 140 and the second through hole 150 and exposes at least a portion of the first conductive interconnection layer 141 and the second conductive interconnection layer 151 on the surface of the first substrate 110 at the periphery of the first through hole 140 and the second through hole 150, respectively. The exposed first conductive interconnection layer 141 serves as the first contact pad 142, and the exposed second conductive interconnection layer 151 serves as the second contact pad 152. The first contact pad 142 and the second contact pad 152 may be connected to an external controller to control operations of the resonant structure 120.

The packaging module of the BAW resonator of the embodiments can be packaged by using the above-mentioned packaging method of the BAW resonator. The bonding layer 210 can be made of a material with a lower hardness, such as a light-curing material (including a dry film) and/or a heat-cured material, so as to use its better step tolerance to be implemented between materials with poor flatness to achieve good bonding, so that the second substrate 200 (as the cap wafer) has a good packaging quality for the BAW resonant device 100. The bonding layer 210 can also be made of a material with a higher hardness, such as at least one of silicon dioxide, nitride, ethyl orthosilicate, and a high-K medium with a dielectric constant K greater than 4. In addition, structures such as the through holes and the conductive interconnection layer for electrically leading out the electrical connection portions of the BAW resonant device 100 are formed at the side of the first substrate 110 away from the second substrate 200, which can avoid undesirable effect on a cap wafer structure where the second gap 20 is located, and at the same time helps to improve the quality of the through holes and the conductive interconnect layer.

In the packaging module of some embodiments, the BAW resonant device may have the structure as shown in FIG. 2 or FIG. 3. Taking the BAW resonant device shown in FIG. 2 as an example, the BAW resonant device 100 includes the support layer 130 disposed on the first substrate 110. A hardness of the support layer 130 may be greater than that of the bonding layer 210. The first gap 10 is substantially defined by the support layer 130, and the resonant structure 120 overlaps the support layer 130. In addition, as shown in FIG. 7, in the packaging module, the first through hole 140 and the second through hole 150 are both provided through the first substrate 110 and the support layer 130. In some other embodiments (referring to FIG. 3), the groove is formed in the first substrate 110 of the BAW resonant device 100, and the resonant structure 120 is located above the groove and overlaps the first substrate 110 surrounding the groove. In those embodiments, the first through hole and the second through hole provided in the BAW resonant device 100 can only pass through the first substrate 110.

Taking the BAW resonant device shown in FIG. 2 as an example, the support layer 130 can be made of materials with a higher hardness than the dry film, such as at least one of silicon dioxide, silicon nitride, silicon oxynitride, aluminum nitride, titanium oxide, and titanium nitride. On one hand, higher support strength can be provided, and on another hand, process control of a through hole etching process is less difficult. When a conductive material is deposited in the holes to form a conductive interconnection layer, a film layer of the conductive interconnection layer is continuous, the quality is higher, and the stability of the conductive interconnection layer is better, which is beneficial to improve the performance of the BAW resonator packaging structure.

The embodiments also include a filter which includes the packaging module of the above-mentioned BAW resonator. The filter may be a radio frequency filter. By improving the packaging method of the BAW resonant device, the manufacturing difficulty is reduced, the performance and reliability of the resonant device are improved, and the performance and reliability of the filter are also improved.

The method and structure in the embodiments are described in a progressive manner. Following method and structure mainly describe differences from previous method and structure, and relevant points can be understood by reference.

As disclosed, the technical solutions of the present disclosure have the following advantages.

The technical solutions of the present disclosure are to bond the BAW resonant device with the second substrate through the bonding layer, form the through holes at the side of the first substrate to expose the electrical connection portions of the resonant structure in the BAW resonant device, and form the conductive interconnection layer on the inner surfaces of the through holes and on a portion of the surface of the first substrate, thereby avoiding steps of through hole etching and depositing conductive material from the bonding layer, so that the material of the bonding layer can be selected with materials providing good bonding effects, which helps reduce process difficulty, and improves the stability of the through holes and the formed packaging module, thereby helping to improve the performance of the BAW resonator packaging structure.

In the technical solutions of the present disclosure, further, the BAW resonant device includes the support layer disposed on the first substrate. The resonant structure is overlapped on the support layer, and the first gap between the resonant structure and the first substrates is substantially surrounded by the support layer. The through holes pass through the first substrate and the support layer, and the support layer can be made of materials with a higher hardness, thereby making the process difficulty of forming through-holes in the support layer lower than that of forming through-holes in the bonding layer, and improving the quality and stability of the through-holes.

In the technical solutions of the present disclosure, further, the material of the bonding layer is a non-metallic material, for example, including at least one of a light-curing material, a heat-curing material, silicon dioxide, nitride, tetraethyl orthosilicate, and a high-K dielectric with a dielectric constant K greater than 4, which can reduce the process difficulty and cost of combining the second substrate and the BAW resonant device, can be highly compatible with the process of the BAW resonant device, and will not cause pollution issues caused by metal bonding process such as an Au—Au bonding, etc.

In the technical solutions of the present disclosure, the same material as the piezoelectric layer in the BAW resonant structure can be used to make the passivation layer, which can be compatible with the first gap process to a greatest extent, while avoiding the problems of temperature drift and introduction of unnecessary stress caused by using other materials to make the passivation layer, thereby improving the resonance performance of the resonator. In addition, the passivation layer fills the through holes, which can enhance the mechanical strength of the BAW resonant device, thereby increasing supporting force of the sidewalls of the first gap of the resonator, and preventing the deformation of the first gap from affecting the resonance performance and reliability of the BAW resonator.

In the technical solutions of the present disclosure, it is possible to choose to form the sidewall protection layer on the sidewalls of the formed through holes before forming the conductive interconnection layer to avoid unnecessary electrical connection problems between the conductive interconnection layer and other structures, thereby ensuring the reliability of the electrical connection between the formed conductive interconnection layer and the resonant structure.

In the technical solutions of the present disclosure, further, the bonding layer can fill the opening on the resonant structure at the periphery of the second gap, thereby tolerating a certain step height difference of the resonant structure in the area outside the second gap. Furthermore, after the second substrate is bonded to the bonding layer, not only the surfaces of the second substrate and the first substrate facing away from each other do not tilt, but also the step height difference of the resonant structure located at the periphery of the second gap facing towards the side of the second substrate can be compensated, to ensure the reliability and stability of the bonding. Moreover, because the side of the first substrate facing away from the second substrate is horizontal, a flat process window can be provided for the manufacturing process of the through holes and the conductive interconnection layer, thereby ensuring the performance of the formed through holes and the conductive interconnection layer.

The foregoing description is only a description of the embodiments of the present disclosure, and does not limit the scope of the present disclosure in any way. Any person skilled in the art can use the methods and technical content disclosed above to make possible changes and modifications of the technical solutions of the present disclosure, without departing from the spirit and scope of the present disclosure. Therefore, all simple modifications, equivalent changes and modifications made to the above embodiments based on the technical essence of the present disclosure without departing from the technical solutions of the present disclosure, belong to the protected range of the technical solutions of the present disclosure.

What is claimed is:

1. A packaging method of a bulk acoustic wave (BAW) resonator, comprising:
   providing a BAW resonant device, wherein the BAW resonant device includes a first substrate and a resonant structure disposed on the first substrate, and a first gap is formed between the resonant structure and the first substrate;
   bonding the BAW resonant device, at a side of the resonant structure, with a second substrate through a bonding layer, wherein a second gap is provided between the resonant structure of the BAW resonant device and the second substrate, and the second gap is substantially surrounded by the bonding layer, and the second gap is at least partially aligned with the first gap;
   forming a first through hole and a second through hole that pass through the first substrate and respectively expose a first electrical connection portion and a second electrical connection portion of the resonant structure around the first gap,
   wherein
      the resonant structure includes a piezoelectric layer,
      the bonding layer includes a first bonding layer portion under the first through hole and a second bonding layer portion under the second through hole, and
      the first bonding layer portion has a sidewall in contact with a sidewall of the piezoelectric layer; and
   forming a conductive interconnection layer on sidewall surfaces and bottom surfaces of the first and second through holes and on a portion of a surface of the first substrate at a periphery of the first and second through holes.

2. The packaging method according to claim 1, wherein:
   the resonant structure includes a first electrode facing towards the first substrate, the piezoelectric layer on the first electrode, and a second electrode on the piezoelectric layer.

3. The packaging method according to claim 2, wherein:
   the first electrical connection portion includes a portion of the first electrode extending out of the first gap; and
   the second electrical connection portion includes a portion of the second electrode extending out of the first gap.

4. The packaging method according to claim 2, wherein:
   the first bonding layer portion is between the second substrate and the first electrode of the resonant structure, and
   the sidewall of the first bonding layer portion has an upper portion in contact with the sidewall of the piezoelectric layer and the second electrode of the resonant structure, and has a lower portion in contact with the second gap.

5. The packaging method according to claim 1, wherein:
   after the BAW resonant device and the second substrate are bonded together and before the first and second through holes are formed, the first substrate is thinned.

6. The packaging method according to claim 1, wherein:
   after the first and second through holes are formed and before the conductive interconnection layer is formed on the inner surfaces of the first and second through holes, a sidewall protection layer is formed over sidewalls of the first and second through holes to avoid electrical connection between the conductive interconnection layer and other structures of the resonant structure along the sidewall surfaces of the first and second through holes, and to ensure electrical connection reliability between the conductive interconnection layer and the resonant structure.

7. The packaging method according to claim 1, wherein after forming the conductive interconnection layer, the method further includes:
   forming a passivation layer, wherein the passivation layer fills the first and second through holes and exposes a portion of the conductive interconnection layer on the portion of the surface of the first substrate at the periphery of the first and second through holes, and the exposed conductive interconnection layer forms contact pads.

8. The packaging method according to claim 7, wherein:
   the passivation layer is made of a material same as the piezoelectric layer, or is made of at least one of silicon oxide, nitride silicon, silicon oxynitride, metal nitride, and polymer.

9. The packaging method according to claim 1, wherein:
   the bonding layer is made of at least one of a light-curing material, a heat-curing material, silicon dioxide, nitride, tetraethyl orthosilicate, and a high-K dielectric medium with a constant K greater than 4.

10. The packaging method according to claim 1, wherein providing the BAW resonant device includes:
   providing a preparation substrate, and sequentially forming a piezoelectric stack film layer and a support layer for forming the resonant structure on the preparation substrate;
   etching the support layer to form the first gap in the support layer;

providing the first substrate, and bonding the first substrate to the support layer; and removing the preparation substrate to form the BAW resonant device.

11. The packaging method according to claim 10, wherein:
before forming the support layer on the piezoelectric stack film layer, or after removing the preparation substrate, the piezoelectric stacked film layer is patterned to form the resonant structure.

12. The packaging method according to claim 1, wherein providing the BAW resonant device includes:
providing the first substrate, and forming a sacrificial layer on a portion of the first substrate;
forming the resonant structure on the sacrificial layer and the first substrate; and
removing the sacrificial layer to form the first gap.

13. The packaging method according to claim 12, wherein:
forming the sacrificial layer on the portion of the first substrate includes: etching the first substrate to form a groove in the first substrate; and forming the sacrificial layer to fill the groove; or forming the sacrificial layer on the portion of the first substrate includes: forming a sacrificial layer material covering the first substrate; and patterning the sacrificial layer material to form a patterned sacrificial layer protruding on the portion of the first substrate.

14. The packaging method according to claim 1, wherein:
outermost sidewalls of the first and second gaps are vertically aligned along a direction perpendicular to a surface of the first or second substrate.

15. The packaging method according to claim 1, wherein:
an orthographic projection of the first through hole falls within an orthographic projection of the first bonding layer portion projected on the second substrate.

16. The packaging method according to claim 1, wherein:
orthographic projections of the second bonding layer portion and the piezoelectric layer overlap on the second substrate, and the first bonding layer portion has a thickness greater than a total thickness of the second bonding layer portion and the piezoelectric layer over the second substrate.

* * * * *